(12) United States Patent
Li et al.

(10) Patent No.: US 9,980,386 B1
(45) Date of Patent: May 22, 2018

(54) FLEXIBLE PRINTED CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Yan-Lu Li, Qinhuangdao (CN); Jun-Hua Wang, Qinhuangdao (CN)

(73) Assignees: HongQiSheng Precision Electronics (QinHuangDao) Co, Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days. days.

(21) Appl. No.: 15/795,198

(22) Filed: Oct. 26, 2017

(30) Foreign Application Priority Data

Sep. 28, 2017 (CN) .......................... 2017 1 0901525

(51) Int. Cl.
| | |
|---|---|
| *H05K 1/18* | (2006.01) |
| *H05K 3/40* | (2006.01) |
| *H05K 3/46* | (2006.01) |
| *H05K 1/11* | (2006.01) |
| *H05K 1/03* | (2006.01) |
| *H05K 3/42* | (2006.01) |

(52) U.S. Cl.
CPC ........... *H05K 1/183* (2013.01); *H05K 1/0393* (2013.01); *H05K 1/111* (2013.01); *H05K 1/115* (2013.01); *H05K 1/189* (2013.01); *H05K 3/4069* (2013.01); *H05K 3/423* (2013.01); *H05K 3/462* (2013.01); *H05K 3/4697* (2013.01); *H05K 2201/09509* (2013.01)

(58) Field of Classification Search
CPC ................................. H05K 1/183; H05K 3/40
See application file for complete search history.

(56) References Cited

U.S. PATENT DOCUMENTS

| | | | | |
|---|---|---|---|---|
| 2015/0156908 | A1* | 6/2015 | Gibbons | ............. H01L 25/0657 361/764 |
| 2016/0081191 | A1* | 3/2016 | Mok | .................... H05K 3/4697 174/257 |
| 2016/0192497 | A1* | 6/2016 | Ryu | .................... H01L 23/5384 361/784 |

* cited by examiner

*Primary Examiner* — Jeremy C Norris
(74) *Attorney, Agent, or Firm* — ScienBiziP, P.C.

(57) ABSTRACT

A method for manufacturing a flexible printed circuit board includes providing a first double-sided circuit substrate which comprises an electronic component. A multilayer circuit substrate having a mounting groove is also provided. The multilayer circuit substrate covers the first double-sided circuit substrate through an adhesive layer, causing the electronic component to be received in the mounting groove, thereby forming an intermediate product. At least one through hole is defined in the intermediate product, which when filled with conductive material electrically connects the multilayer circuit substrate to the first double-sided circuit substrate to form the flexible printed circuit board.

11 Claims, 5 Drawing Sheets

FLEXIBLE PRINTED CIRCUIT BOARD AND METHOD FOR MANUFACTURING THE SAME

FIELD

The subject matter herein generally relates to circuit boards, and particularly, to a flexible printed circuit board (FPCB) and a method for manufacturing an FPCB.

BACKGROUND

Many portable electronic devices, such as cell phones, tablet computers, and multimedia players, usually include circuit boards. Electronic components of a circuit board, such as resistors or capacitors, are usually embedded in a substrate of the circuit board in order to decrease the thickness of the portable electronic device. During manufacturing, the passive components are disposed between two resin layers, and the two resin layers are pressed and connected to each other, thereby embedding the passive components within the two resin layers. However, the electronic components may be damaged when pressed. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
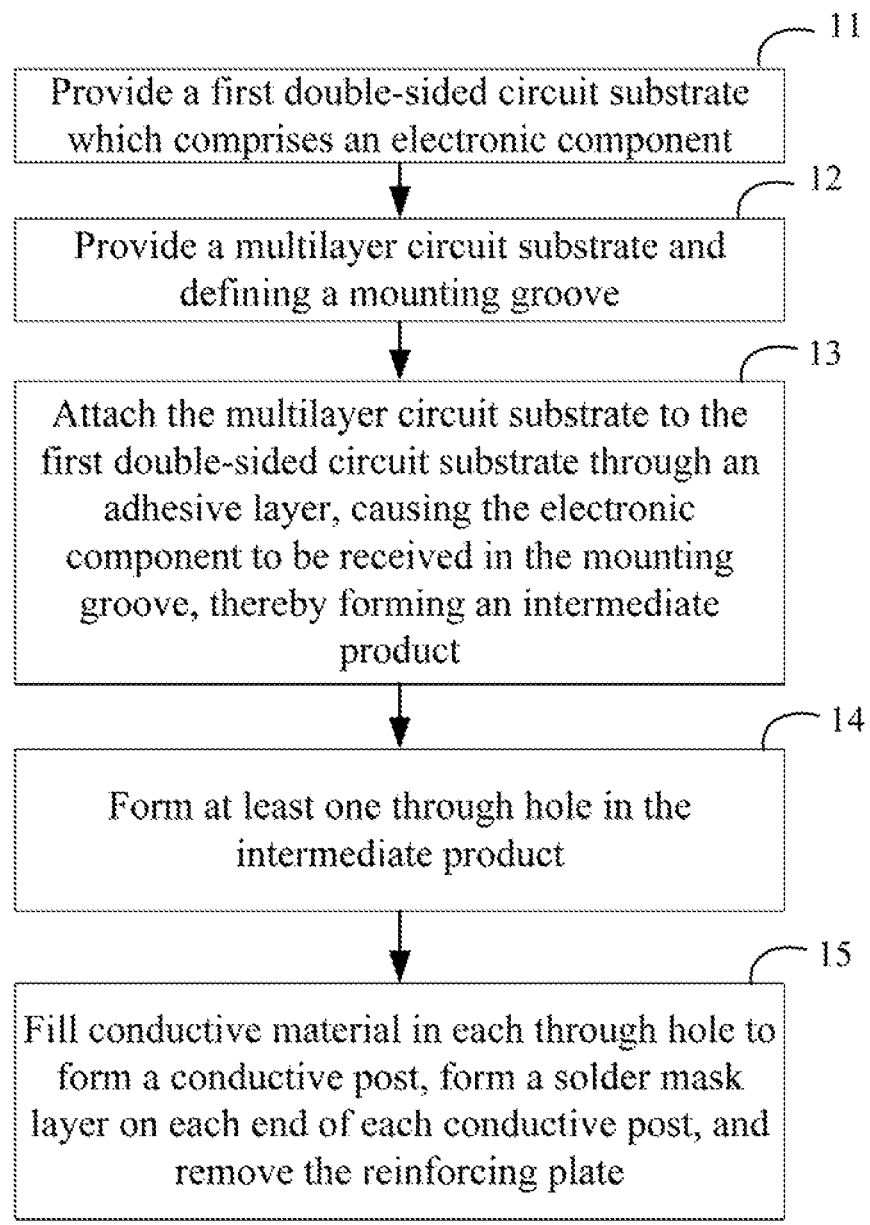
FIG. 1 is a flowchart of an exemplary embodiment of a method for manufacturing an FPCB.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a method for manufacturing an FPCB is presented in accordance with an exemplary embodiment. The method for manufacturing the FPCB is provided by way of example, as there are a variety of ways to carry out the method. The exemplary method can begin at block 11.

Figure 2:
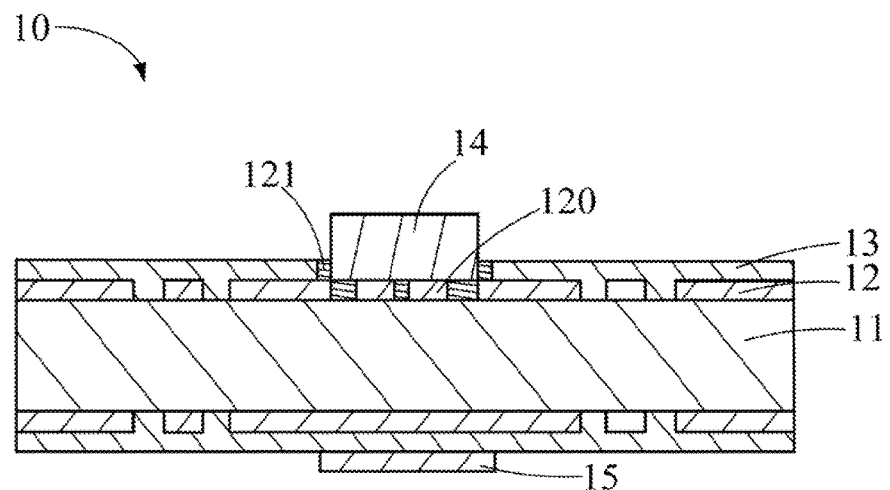
FIG. 2 is a diagrammatic view of a first double-sided circuit substrate used in the method of FIG. 1.

At block 11, referring to FIG. 2, a first double-sided circuit substrate 10 is provided that comprises a first base layer 11, two first conductive wiring layers 12 formed on opposite surfaces of the first base layer 11, and a first isolated layer 13 formed on one surface of each first conductive wiring layer 12 facing away from the first base layer 11. One of the first conductive wiring layers 12 is exposed from the first isolated layer 13 to form at least one pad 120. An electronic component 14 is electrically connected to the pad 120. A reinforcing plate 15 is connected to one first isolated layer 13 opposite to the electronic component 14.

In at least one exemplary embodiment, the electronic component 14 is an IC chip.

In at least one exemplary embodiment, each pad 120 is protected by surface treatment to form a protection layer 121 on the pad 120 to avoid oxidation. The surface treatment can be chemical-plating. The number of the pad(s) 120 can be varied according to the number of the electronic component(s) 14 and the number of the pins of the electronic component(s) 14.

In at least one exemplary embodiment, the first base layer 11 is made of a polymer selected from a group consisting of polyimide, liquid crystal polymer (LCP), polytetrafluoroethylene, poly thiamine, poly (methyl methacrylate), polycarbonate, polyethylene terephthalate, polyimide-polyethylene terephthalate, and any combination thereof.

Figure 3:
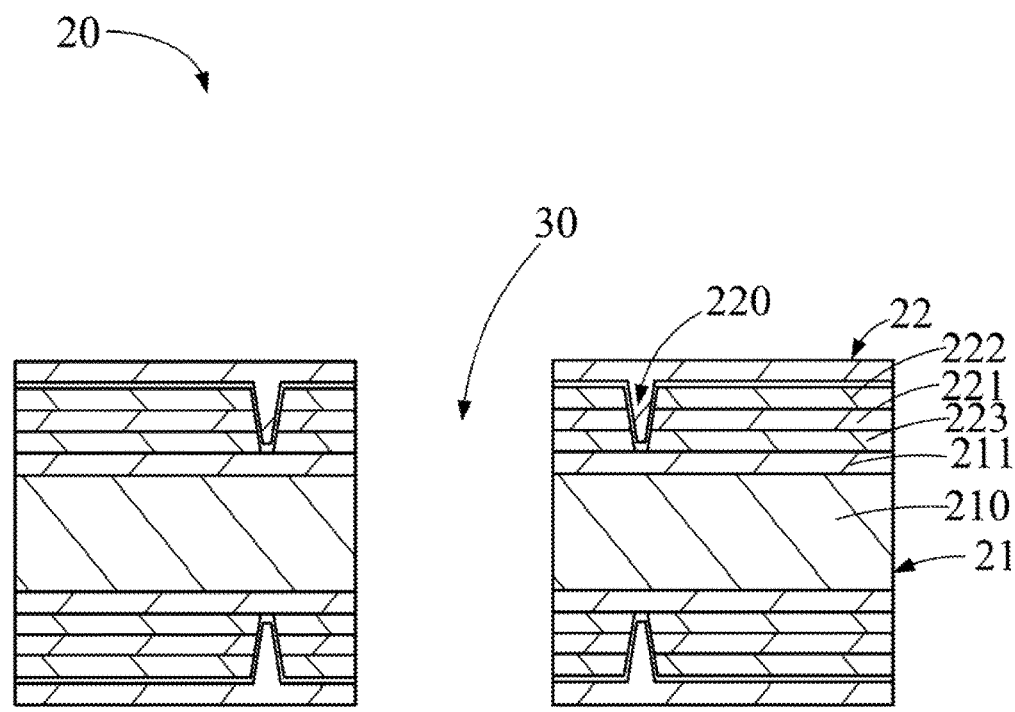
FIG. 3 is a diagrammatic view of a multilayer circuit substrate used in the method of FIG. 1.

At block 12, referring to FIG. 3, a multilayer circuit substrate 20 is provided, and a mounting groove 30 is defined in the multilayer circuit substrate 20 and passes through the multilayer circuit substrate 20.

The multilayer circuit substrate 20 comprises a second double-sided circuit substrate 21. The second double-sided circuit substrate 21 comprises a second base layer 210 and two second conductive wiring layers 211 formed on two opposite surfaces of the second base layer 210.

The multilayer circuit substrate 20 further comprises at least one circuit substrate 22 formed on each surface of the second double-sided circuit substrate 21 through a build-up process. Each circuit substrate 22 comprises a second isolated layer 221 formed on the surface of the second double-sided circuit substrate 21 through an adhesive layer 223 and a third conductive wiring layer 222 formed on the second isolated layer 221. That is, the mounting groove 30 passes through each third conductive wiring layer 222, each second isolated layer 221, the adhesive layer 223, and the second double-sided circuit substrate 21. The circuit substrate 22 defines at least one blind hole 220, for electrically connecting each third conductive wiring layer 222 to the second conductive wiring layer 211 when forming conductive material on an inner wall of the blind hole 220.

Figure 4:
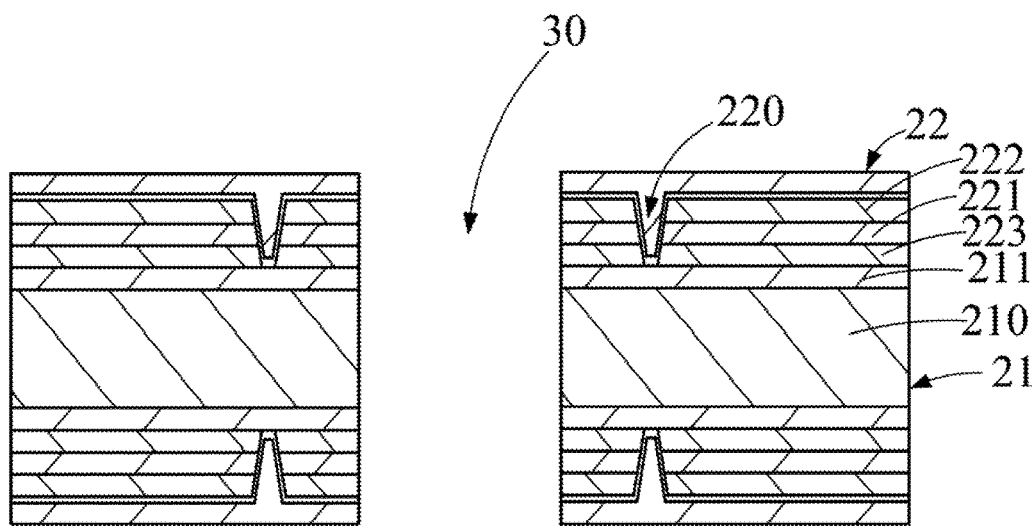
FIG. 4 is a diagrammatic view showing the multilayer circuit substrate of FIG. 3 covering the first double-sided circuit substrate of FIG. 2 to form an intermediate product.

At block 13, referring to FIG. 4, the multilayer circuit substrate 20 is attached to the first double-sided circuit substrate 10 through an adhesive layer 40, causing the electronic component 14 to be received in the mounting groove 30, thereby forming an intermediate product 200.

In at least one exemplary embodiment, the adhesive layer 40 is made of an adhesive resin selected from a group consisting of polypropylene (PP), epoxy resin, polyurethane (PU), phenolic resin, urea-formaldehyde resin, melamine-formaldehyde resin, polyimide, and any combination thereof.

Figure 5:
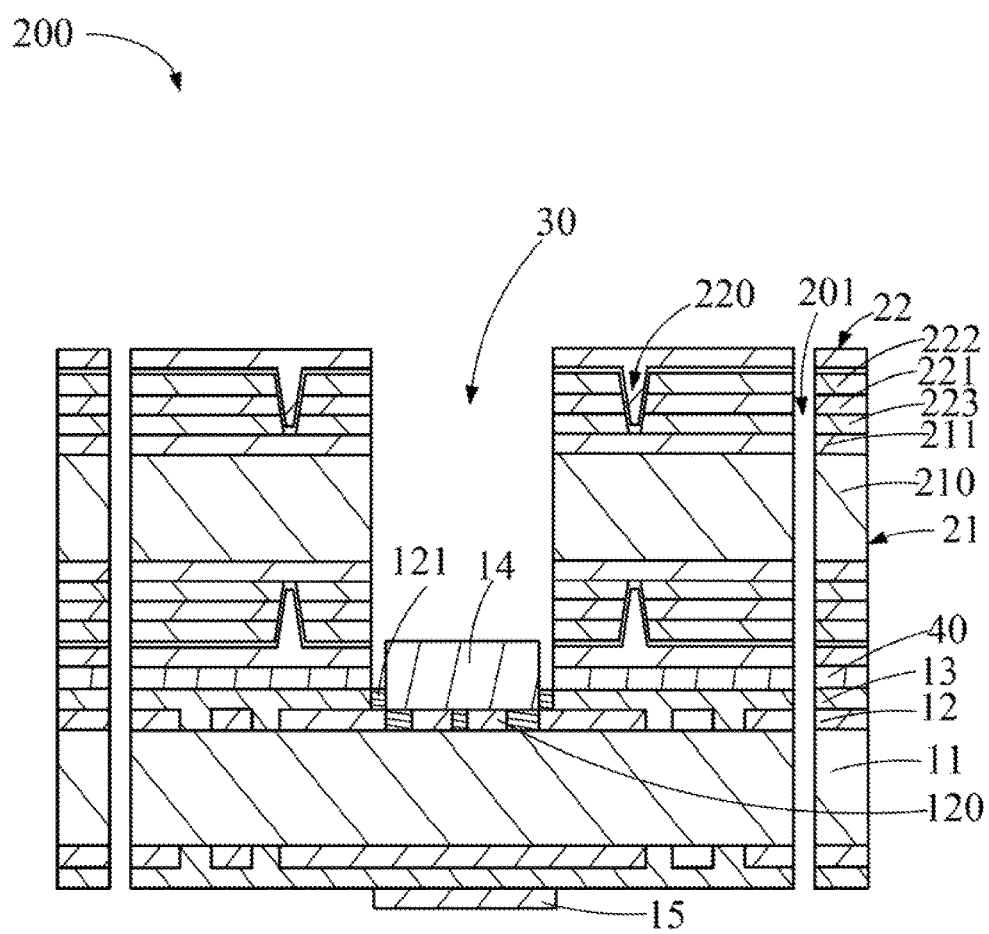
FIG. 5 is a diagrammatic view showing at least one through hole defined in the intermediate product of FIG. 4.

At block 14, referring to FIG. 5, at least one through hole 201 is defined in the intermediate product 200. FIG. 5 shows that two through holes 201 are provided, each through hole 201 positioned on an opposite side of the mounting groove 30.

In at least one exemplary embodiment, each through hole 201 passes through the multilayer circuit substrate 20, the adhesive layer 40, and the first double-sided circuit substrate 10. The number of the through hole(s) 201 can be varied as needed.

Figure 6:
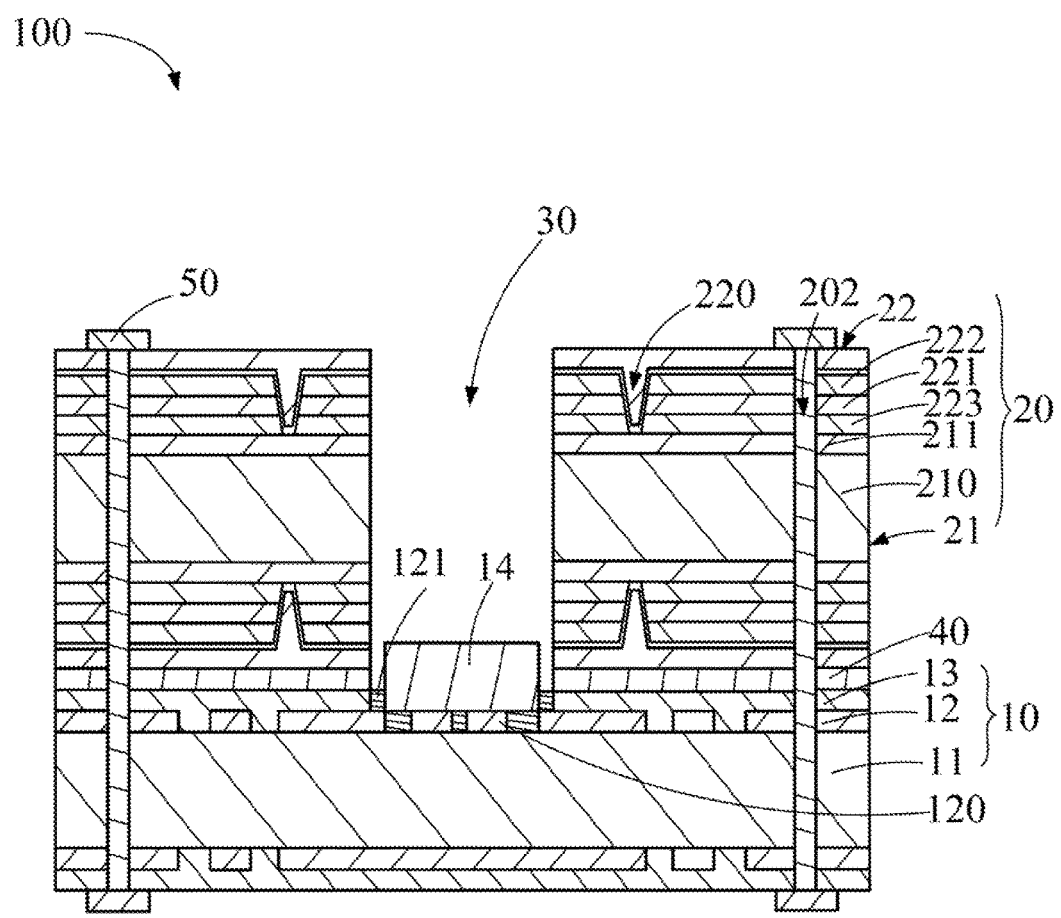
FIG. 6 is a diagrammatic view showing conductive material filling the through hole of FIG. 5 to form the FPCB.

At block 15, referring to FIG. 6, a conductive material is filled in each through hole 201 to form a conductive post 202 that electrically connects each third conductive wiring layer 222 to the second conductive wiring layer 211 and to the first conductive wiring layer 12. Furthermore, a solder mask layer 50 is formed on each end of each conductive post 202, and the reinforcing plate 15 is removed, thereby forming the FPCB 100.

In at least one exemplary embodiment, the conductive material is conductive paste, for example, the conductive material can be conductive copper paste.

In other exemplary embodiments, the conductive material is electroplated copper.

In at least one exemplary embodiment, the solder mask layer 50 is made of solder mask ink.

FIG. 6 illustrates an exemplary embodiment of an FPCB 100. The FPCB 100 comprises a first double-sided circuit substrate 10, an adhesive layer 40, and a multilayer circuit substrate 20 attached to the first double-sided circuit substrate 10 through the adhesive layer 40.

The double-sided circuit substrate 10 comprises a first base layer 11, two first conductive wiring layers 12 formed on opposite surfaces of the first base layer 11, and a first isolated layer 13 formed on one surface of each first conductive wiring layer 12 facing away from the first base layer 11. One of the first conductive wiring layers 12 is exposed from the first isolated layer 13 to form at least one pad 120. An electronic component 14 is electrically connected to the pad 120.

A mounting groove 30 is defined in the multilayer circuit substrate 20 that passes through the multilayer circuit substrate 20. The electronic component 14 is received in the mounting groove 30. The multilayer circuit substrate 20 comprises a second double-sided circuit substrate 21. The second double-sided circuit substrate 21 comprises a second base layer 210 and two second conductive wiring layers 211 formed on two opposite surfaces of the second base layer 210.

The multilayer circuit substrate 20 further comprises at least one circuit substrate 22 formed on each surface of the second double-sided circuit substrate 21 through a build-up process. Each circuit substrate 22 comprises a second isolated layer 221 formed on the surface of the second double-sided circuit substrate 21 through an adhesive layer 223 and a third conductive wiring layer 222 formed on the second isolated layer 221. That is, the mounting groove 30 passes through each third conductive wiring layer 222, each second isolated layer 221, the adhesive layer 223, and the second double-sided circuit substrate 21. The circuit substrate 22 defines at least one blind hole 220, for electrically connecting each third conductive wiring layer 222 to the second conductive wiring layer 211 when forming conductive material on an inner wall of the blind hole 220.

At least one conductive post 202, which electrically connects each third conductive wiring layer 222 to the second conductive wiring layer 211 and the first conductive wiring layer 12, is formed in the intermediate product 200. A solder mask layer 50 is formed on each end of each conductive post 202.

In at least one exemplary embodiment, each conductive post 202 is formed by filling conductive material in a through hole 201 passing through the multilayer circuit substrate 20, the adhesive layer 40, and the double-sided circuit substrate 10.

The mounting groove 30 defined in the multilayer circuit substrate 20 relieves certain problems. When the multilayer circuit substrate 20 is pressed against the first double-sided circuit substrate 10, the electronic component 14 can be received in the mounting groove 30, thereby avoiding damage to the electronic component 14 when pressed. Furthermore, the electronic component 14 is electrically connected to the inner circuit, thereby decreasing the wiring length and the thickness of the FPCB 100.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a flexible printed circuit board comprising:
  providing a first double-sided circuit substrate which comprises an electronic component, wherein the first double-sided circuit substrate further comprises a first base layer, two first conductive wiring layers formed on two opposite surfaces of the first base layer, and a first isolated layer formed on one surface of each first conductive wiring layer facing away from the first base layer, one of the first conductive wiring layers being exposed from the first isolated layer to form at least one pad, the electronic component is electrically connected to the pad;
  providing a multilayer circuit substrate and defining a mounting groove in the multilayer circuit substrate, wherein multilayer circuit substrate comprises a second double-sided circuit substrate, the second double-sided circuit substrate comprises a second base layer and two second conductive wiring layers formed on two opposite surfaces of the second base layer, the multilayer circuit substrate further comprises at least one circuit substrate formed on each surface of the second double-sided circuit substrate through a build-up process, each circuit substrate comprises a second isolated layer formed on the surface of the second double-sided circuit substrate through an adhesive layer and a third conductive wiring layer formed on the second isolated layer, the mounting groove passes through each third conductive wiring layer, each second isolated layer, the adhesive layer, and the second double-sided circuit substrate, the circuit substrate defines at least one blind hole, for electrically connecting each third conductive wiring layer to the second conductive wiring layer when forming conductive material on an inner wall of the blind hole;
  attaching the multilayer circuit substrate to the first double-sided circuit substrate through an adhesive layer, causing the electronic component to be received in the mounting groove, thereby forming an intermediate product; and forming at least one conductive post in the intermediate product which electrically connects the multilayer circuit substrate to the first double-sided circuit substrate, thereby forming the flexible printed circuit board.

2. The method of claim 1, wherein each pad is protected by surface treatment to form a protection layer on the pad.

3. The method of claim 1, wherein the first base layer is made of a polymer selected from a group consisting of polyimide, liquid crystal polymer, polytetrafluoroethylene, poly thiamine, poly (methyl methacrylate), polycarbonate, polyethylene terephthalate, polyimide-polyethylene terephthalate, and any combination thereof.

4. The method of claim 1, wherein the step of forming at least one conductive post in the intermediate product further comprises:
   defining at least one through hole in the intermediate product, each through hole passing through the multilayer circuit substrate, the adhesive layer, and the double-sided circuit substrate; and
   filling conductive material in each through hole to form the conductive post.

5. The method of claim 4, further comprising:
   forming a solder mask layer on each end of each conductive post.

6. The method of claim 4, wherein the conductive material is conductive paste.

7. A flexible printed circuit board comprising:
   a first double-sided circuit substrate which comprises an electronic component, wherein the first double-sided circuit substrate further comprises a first base layer, two first conductive wiring layers formed on two opposite surfaces of the first base layer, and a first isolated layer formed on one surface of each first conductive wiring layer facing away from the first base layer, one of the first conductive wiring layers is exposed from the first isolated layer to form at least one pad, the electronic component is electrically connected to the pad;
   an adhesive layer; and
   a multilayer circuit substrate attached to the first double-sided circuit substrate through the adhesive layer, the multilayer circuit substrate defining a mounting groove, the electronic component received in the mounting groove, the multilayer circuit substrate, the adhesive, and the first double-sided circuit substrate forming at least one conductive post, each conductive post electrically connecting the multilayer circuit substrate to the first double-sided circuit substrate;
   wherein the multilayer circuit substrate comprises a second double-sided circuit substrate; the second double-sided circuit substrate comprises a second base layer and two second conductive wiring layers formed on two opposite surfaces of the second base layer; the multilayer circuit substrate further comprises at least one circuit substrate formed on each surface of the second double-sided circuit substrate through a build-up process, each circuit substrate comprises a second isolated layer formed on the surface of the second double-sided circuit substrate through an adhesive layer and a third conductive wiring layer formed on the second isolated layer; the mounting groove passes through each third conductive wiring layer, each second isolated layer, the adhesive layer, and the second double-sided circuit substrate; the circuit substrate defines at least one blind hole, for electrically connecting each third conductive wiring layer to the second conductive wiring layer when forming conductive material on an inner wall of the blind hole.

8. The flexible printed circuit board of claim 7, wherein each pad is protected by surface treatment to form a protection layer on the pad.

9. The flexible printed circuit board of claim 7, wherein the first base layer is made of a polymer selected from a group consisting of polyimide, liquid crystal polymer, polytetrafluoroethylene, poly thiamine, poly (methyl methacrylate), polycarbonate, polyethylene terephthalate, polyimide-polyethylene terephthalate, and any combination thereof.

10. The flexible printed circuit board of claim 7, wherein a solder mask layer is formed on each end of each conductive post.

11. The flexible printed circuit board of claim 7, wherein the conductive material is conductive paste.

* * * * *